United States Patent [19]

Sakurai

[11] Patent Number: 5,293,101
[45] Date of Patent: Mar. 8, 1994

[54] DRIVING CIRCUIT APPARATUS FOR CRT
[75] Inventor: Hisao Sakurai, Kanagawa, Japan
[73] Assignee: Sony Corporation, Tokyo, Japan
[21] Appl. No.: 916,380
[22] Filed: Jul. 21, 1992
[30] Foreign Application Priority Data Jul. 25, 1991 [JP] Japan .................................. 3-210135

[51] Int. Cl.⁵ .............................................. H01J 29/52
[52] U.S. Cl. ..................................... 315/383; 358/518
[58] Field of Search ...................... 315/383; 358/75, 80

[56] References Cited

U.S. PATENT DOCUMENTS 4,893,178  1/1990  Matama et al. ......................... 358/80
5,087,966  2/1992  Harradine ............................... 358/27

Primary Examiner—Theodore M. Blum
Attorney, Agent, or Firm—Lewis H. Eslinger; Jay H. Maioli

[57] ABSTRACT

In a driving circuit apparatus, an input video signal is logarithmically compressed via the logarithmic converting means and outputted to the exponential converting means of the next stage. The exponential converting means outputs the inputted input video signal upon inverse logarithmically converted, to the driving means which controls the image receiving tube. Since the input video signal is logarithmically compressed via the logarithmic converting means, although in case of being inputted the high frequency input video signal for high resolution, the slewing rate does not increase, and accordingly, the wideband pre-drive circuit can be more easily built in the IC.

9 Claims, 3 Drawing Sheets

DRIVING CIRCUIT APPARATUS FOR CRT

BACKGROUND OF THE INVENTION

The present invention relates to a driving circuit apparatus, and more particularly to applying to drive the cathode ray tube (CRT), which is especially required high resolution.

In conventional cathode ray tube (CRT) display device to be used for computer aided design (CAD), it is necessary to display high resolution image on the tube compared with an ordinary CRT display device.

To display high resolution image in the CRT display device for the computer aided design, a high frequency video signal, 150 [MHz] as against an ordinary video signal of 10 [MHz], is supplied to the display device via the voltage output type image output circuit 1A (FIG. 1) and the current output type image output circuit 1B (FIG. 2).

More specifically, the image output circuit 1A amplifies an input video signal $V_{in}$ quintuple by the first step pre-drive amplifier 2 and further amplifies fifteen-fold at the outer attached cathode drive amplifier 3, and supplies to the CRT 4 as an output image signal $V_{out}$.

In a case when an input video signal $V_{in}$ with a peak value of 0.6 [$V_{pp}$], showing maximum amplitude from positive side wave crest value to negative side wave crest value, is inputted, it is necessary that the input video signal $V_{in}$ is amplified to 3.0 [$V_{pp}$] when outputted from the pre-drive amplifier 2, and to be outputted to the CRT 4 as approximately 45 [$V_{pp}$] output image signal $V_{out}$ via the cathode drive amplifier 3.

In case of amplifying this input video signal $V_{in}$ at the voltage output type pre-drive amplifier 2 (FIG. 1), the cathode drive amplifier 3 supplies a video signal V1 to be outputted from the pre-drive amplifier 2, to the base of transistor Q1 via the buffer circuit 5.

Here, said transistor Q1 is a NPN type transistor and is constituted by an emitter follower amplifying stage as well as resistance R1.

A collector of said transistor Q1 is cascade connected to a transistor Q2 which constitutes constant current source to compensate merits in high frequency band of the transistor Q1 and for having higher pressure proof for high voltage power source.

A collector of the transistor Q2 is connected to load resistance R2 connected to high voltage power source of 60 [V], and is arranged to output an output image signal $V_{out}$ from the connecting node PO of the collector and load resistance R2 via the buffer circuit 6.

In case of amplifying the input video signal $V_{in}$ at the current output type pre-drive amplifier 2 (FIG. 2), the cathode drive amplifier 3 supplies electric current outputted from the pre-drive amplifier 2 to an emitter of transistor Q3, and outputs the output image video signal $V_{out}$ from the connecting node P1 of collector connected load resistance R3 and the transistor Q3 via the buffer circuit 7.

At this time, the base of driving transistor Q3 is supplied with reference power source $V_{ref}$ and large electric current of 150 [$mA_{pp}$] flows to load resistance R3.

In thus constructed image output circuit 1A (FIG. 1), if the CRT 4 is driven by high frequency video signal $V_{in}$, such as 150 [MHz], a signal amplitude of 45 [$V_{pp}$] is necessary at an output terminal of the cathode drive amplifier 3. Thus, a signal amplitude of 3.5 [$V_{pp}$] is needed at an output terminal of the pre-drive amplifier 2, and at this time, a slewing rate SR of the video signal $V_{in}$ to be outputted from the pre-drive amplifier 2 becomes 2 [V/ns], 1,000 times more than an ordinary slewing rate SR, is necessary.

However, since it is necessary to run much electric current and increase driving voltage to satisfy such a high slewing rate SR, it was difficult to have the voltage output type pre-drive amplifier 2 built in the IC, which is unable to run much electric current, when inputting a video signal of over 100 [MHz] frequency for high resolution.

In case of driving the CRT 4 with 150 [MHz] signal $V_{in}$ via the image output circuit 1B as shown in FIG. 2, provided that a resistance value of the load resistance R3 connected to the output terminal is 300 [Ω], it is necessary to drive control the driving transistor Q3 running 150 [mA] (=45 [V]/300[Ω]) electric current at the output stage of pre-drive amplifier 2. However, if the pre-drive amplifier 2 is built in the IC, it is difficult to control such big electric current as 150 [mA] because an electric current capacity in the IC is as small as about 1 [mA]. Therefore, in case of driving the CRT 4 which requires high resolution, it was difficult to have the pre-drive amplifier 2 built in the IC.

SUMMARY OF THE INVENTION

In view of the foregoing, an object of this invention is to provide a driving circuit apparatus for CRT capable of having the wideband amplifier in which the video signal with high frequency for high resolution is inputted, easily built in the IC.

The foregoing object and the other objects of the invention have been achieved by the provision of a driving circuit apparatus comprising a logarithmic converting means 11 for logarithmically compressing and outputting an input video signal $V_{in}$, the exponential converting means 12 for inverse logarithmically converting and outputting output video signals $V_{in1}$ outputted from the logarithmic converting means 11 as output video signals, and the driving means 12 for outputting the output image signals outputted from the exponential converting means 12 to an image receiving tube 13 and for drive controlling said image receiving tube:

a driving circuit apparatus for CRT comprising the logarithmic converting means 11 which includes first pair of transistors Q11 and Q12, constant current sources 14 and 15 connected to each emitter of said first pair of transistors Q11 and Q12, load resistance R11 which is connected between the connecting nodes of emitters of said transistors Q11 and Q12 and constant current sources 14 and 15, and diodes D1 and D2 which are connected to collectors of the transistors Q11 and Q12 to output an in-phase output $V_{in2}$ and an inverse output $V_{in1}$ of the input video signal $V_{in}$ upon logarithmically compressed; and the exponential converting means 12 which comprises a differential amplifier 20 which inputs the in-phase output $V_{in2}$ and inverse output $V_{in1}$, constant current circuit 21 connected to emitters connected in common of the differential amplifier 20, second pair of transistors Q15 and Q16 cascade connected to the other side terminals of the differential amplifier 20, current mirror constant current circuit 22 connected to the differential amplifier 20 via the transistors Q15 and Q16, and load resistance R14 connected to the connecting node P3 of the transistor Q16 and current mirror constant current circuit 22:

a driving circuit apparatus for CRT comprising the logarithmic converting means 11 which includes a pair of transistors Q11 and Q12, constant current sources 14 and 15 connected to each emitter of the transistors Q11 and Q12, load resistance R11 which is connected between the connecting nodes of emitters of the transistors Q11 and Q12 and the constant current sources 14 and 15, and diodes D1 and D2 which are connected to the each collector of the transistors Q11 and Q12 to output the in-phase output $V_{in2}$ and the inverse output $V_{in1}$ of the input video signal $V_{in}$ upon logarithmically compressed; and the exponential converting means 12 which comprises a differential amplifier 41 inputting the in-phase output $V_{in2}$ and the inverse output $V_{in1}$, constant current circuit 42 connected to emitters connected in common of the differential amplifier 41, transistor Q43 cascade connected to the other side terminals of the differential amplifier 41, and load resistance R41 connected to the differential amplifier 41 via the transistor Q43: and a driving circuit apparatus for CRT comprising the logarithmic converting means 11 which has first pair of transistors Q11 and Q12, constant current sources 14 and 15 connected to each emitter of the first pair of transistors Q11 and Q12, load resistance R11 which is connected between the connecting nodes of emitters of the transistors Q11 and Q12 and constant current sources 14 and 15, and diodes D1 and D2 which are connected to each collector of the transistors Q11 and Q12 to output the in-phase output $V_{in2}$ and inverse output $V_{in1}$ of the input video signal $V_{in}$ upon logarithmically compressed; and exponential converting means which has differential amplifier 31 for inputting the in-phase output $V_{in2}$ and the inverse output $V_{in1}$, constant current source 32 connected to emitters connected in common of the differential amplifier 31, emitter earthed driving transistor Q33 for inputting the output from the differential amplifier 31 to the base thereof, a buffer transistor Q34 cascade connected to the driving transistor Q33, and a load resistance R33 connected to the collector of the buffer transistor Q34.

In the driving circuit apparatuses for CRT, a slewing rate of the pre-drive circuit can be remarkably decreased compared to that of the prior art, by logarithmically compressing an input video signal via the logarithmic converting circuit and outputting the input video signal after amplifying at the exponential converting circuit to the image receiving tube as an output image signal, and also in the case when the frequency of the input video signal is high, the output image signal with large amplitude can be outputted.

Accordingly, the wideband amplifier can be more easily built in the IC.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 1:
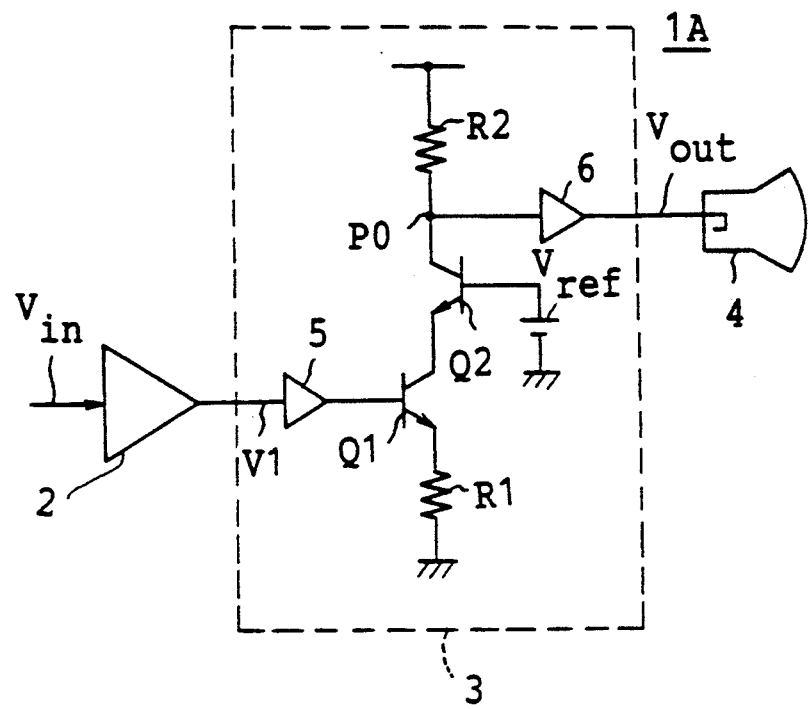
FIG. 1 is a circuit diagram describing the voltage output type image output device of the prior art.
Figure 2:
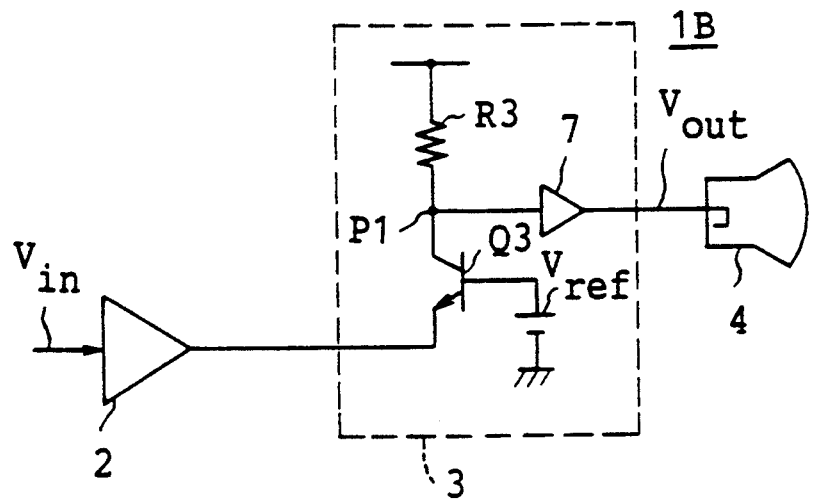
FIG. 2 is a circuit diagram describing other voltage output type video image output device of the prior art.
Figure 3:
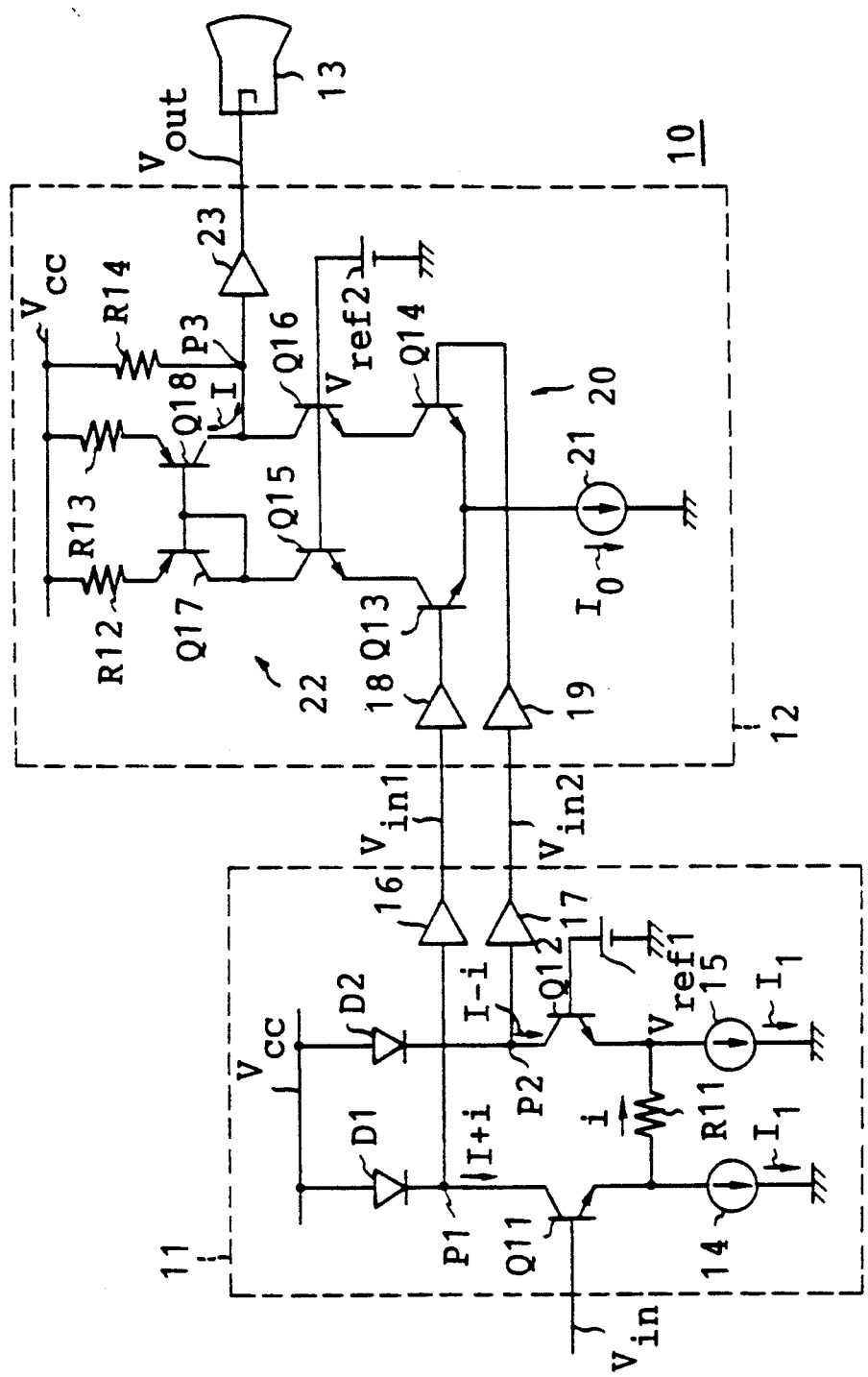
FIG. 3 is a circuit diagram showing an image output device of the first embodiment according to the present invention.

Preferred embodiments of this invention will be described with reference to the accompanying drawings:

FIG. 3 shows the first embodiment according to the present invention.

Designated generally at 10 in FIG. 3 is an image output circuit, and video output signals $V_{in1}$ and $V_{in2}$ to be outputted from the pre-drive amplifier 11 which is built in the IC, and is outputted to CRT 13 as an output image signal $V_{out}$ via the cathode drive amplifier 12.

The pre-drive amplifier 11 comprises a pair of NPN type transistors Q11 and Q12 emitters of which are connected each other via resistance R11.

Furthermore, emitters of the transistors Q11 and Q12 are connected to constant current sources 14 and 15, and the input video signal $V_{in}$ and reference voltage $V_{ref1}$ can be supplied to the bases thereof.

Then, collectors of the transistors Q11 and Q12 are connected to the current source voltage via diodes D1 and D2, and the inverse video output signal $V_{in1}$ and in-phase video output signal $V_{in2}$ made of logarithmically compressed the input video signal $V_{in}$, will be outputted from connecting node P1 and P2 of the diodes D1 and D2 via buffer circuits 16 and 17.

At this time, a peak value of the video output signals $V_{in1}$ and $V_{in2}$ outputted from the pre-drive amplifier 11 is approximately 100 [mV] and this value is 1/35 of the conventional peak value.

Accordingly, the slewing rate SR at the pre-drive amplifier 11 can be decreased to 1/35 of the conventional slewing rate, and without increasing the driving current, the slewing rate SR can be decreased up to such a degree that the pre-drive amplifier 11 can be built-in the IC.

A cathode drive amplifier 12 supplied video output signals $V_{in1}$ and $V_{in2}$ outputted from the pre-drive amplifier 11 to the bases of a pair of transistors Q13 and Q14 which constitute the differential amplifier 20, via buffer circuits 18 and 19.

The emitters of transistors Q13 and Q14 are connected to a common constant current source 21 in common, and can be connected to the current mirror constant current circuit 22 via the cascade transistors Q15 and Q16.

The current mirror constant current circuit 22 having a pair of PNP type transistors Q17 and Q18, and emitters of the transistors Q17 and Q18 are connected to power source voltage $V_{cc}$ via load resistances R12 and R13.

The transistor Q18 which constitutes the current mirror constant current circuit 22 is push-pull operated with the transistor Q14 which constitutes the differential amplifier 20.

More specifically, while the transistor Q18 operates to pull up the output image signal $V_{out}$, the transistor Q14 operates to pull down the output image signal $V_{out}$.

Then, a load resistance R14 is connected to the power source voltage $V_{cc}$ at the connecting node P3 of the transistors Q16 and Q18, and the output image signal $V_{out}$ which is current voltage converted at the load resistance R14, will be outputted to the CRT 13 via buffer circuit 23.

In the construction described above, for instance, in a case when high frequency, such as 150 [MHz] input video signal $V_{in}$ is inputted in the transistor Q11 of pre-drive amplifier 11, which constitutes logarithmic converting circuit, the pre-drive amplifier 11 can output the video signal $V_{in1}$ upon logarithmically compressed to an amplitude of about 100 [mV], from the connecting nodes P1 and P2.

More specifically, the current value $i$ ($=\Delta V/r$), to be obtained dividing the electric potential difference $\Delta V$ of the reference voltage $V_{ref}$ and input video signal $V_{in}$ by the reference value $r$, runs in the resistance R11 connected to emitters of the transistors Q11 and Q12.

At this point, since the current capacity to run in the diode D1 increases by the current value $i$, the video output signal $V_{in1}$, inverted against the input video signal $V_{in}$, is outputted to the connecting node P1, and since the current capacity to run in the other side diode D2 decreases by the current value $i$, the video output signal $V_{in2}$ having the same phase as the input video signal $V_{in}$, is outputted to connecting node P2.

Here, the amplitude of the video output signals $V_{in1}$ and $V_{in2}$ is compressed by logarithmic characteristic of PN junction voltage of the diodes D1 and D2.

This amplitude value is 1/35 (100 [mV]/3.5 [V]), as against the amplitude of the video output signals $V_{in1}$ and $V_{in2}$ to be outputted from the conventional pre-drive amplifier was 3.5 [V].

Thus, the slewing rate SR of the pre-drive amplifier 11 becomes to 57 [mV/ns], e.g., 57 [V/μs], 1/35 of the conventional 2 [V/ns]; therefore, the pre-drive amplifier 11 can be easily built in the IC.

At this time, the driving voltage needed more than 3.5 [V], e.g., the driving electric source voltage $V_{cc}$ in the IC can be decreased to such as 2 [V].

The pre-drive amplifier 11 supplies logarithmically compressed video output signals $V_{in1}$ and $V_{in2}$ to the bases of a pair of transistors Q13 and Q14 which constitute the differential amplifier 20 of the cathode drive amplifier 12.

At this time, the cathode drive amplifier 12 which constitutes the inverse logarithmic (exponential) converting circuit, composes the push-pull amplifier with the current mirror constant current circuit 22 and driving transistor Q14; and when the output video signal $V_{out}$ goes up, the transistor Q18 of current mirror constant current circuit 22 side supplies the current to the load resistance R14 of output stage.

On the other hand, when the output voltage $V_{out}$ goes down, the transistor Q14 draws current from the load resistance R14 of output stage. And the driving capacity of driving voltage $V_{out}$ of the CRT 13 at the connecting node P3 increases up to such high frequency component, i.e., as precisely outlined image can be displayed on the type screen of the CRT 13.

Hence, the output voltage $V_{out}$ will be computed from the following equation wherein I is the video signal current running in the load resistance R14 of the output step and R is the resistance value of the load resistance R14:

$$V_{OUT} = R \cdot I \quad (1)$$

At this point, the video signal current I wherein $I_0$ is current running to the constant current source 21 connected to the differential amplifiers Q13 and Q14; I is current running in the constant current sources 14 and 15 connected to the driving transistors Q11 and Q12 of pre-drive amplifier 11; can be expressed as the following equation:

$$I = \frac{I_0}{I_1} \cdot \frac{V_{in}}{r} \quad (2)$$

Then, the gain G ($=V_{out}/V_{in}$) of the image output circuit 10 can be expressed using equations (1) and (2) as follows:

$$G = \frac{V_{out}}{V_{in}} = \frac{R \cdot I \cdot I_0}{r \cdot I_1 \cdot I} = \frac{I_0}{I_1} \cdot \frac{R}{r} \quad (3)$$

Contrary to the current I to be outputted via the constant current sources 14 and 15 in the IC is a fixed value, the other current value $I_0$ and resistance values r and R are values of external connecting circuits and can be adjusted to the optional values.

Accordingly, in case of color adjusting three primary colors is necessary, if the current $I_0$ is adjusted, the gain G can easily be varied, and as a result, the output voltage of the amplifier corresponding to three primary colors, R, G and B, can be adjusted precisely and thus light emitting characteristic can be adjusted.

The driving transistors Q13 and Q14 derive dispersion of operating characteristic in manufacturing, and there are cases where offsets are derived on the output image signal $V_{out}$ at the connecting node P3. However, the voltage of the connecting node P3 can be stabilized by giving the direct current feedback.

According to the foregoing construction, in a case when a high frequency input video signal $V_{in}$ for driving the CRT 13 which is required high resolution, is inputted, the slewing rate SR of the pre-drive amplifier 11 can be smaller than the past, and thus the electric power consumption can be decreased and the pre-drive amplifier 11 can be built in the IC more easily.

Furthermore, the crosstalks between currents can be decreased and planning of the wideband pre-drive circuit and cathode drive circuit with smaller deterioration of frequency characteristic can be done more easily by changing the output of the cathode drive amplifier 12 which constitutes the inverse logarithmic converting circuit to differential amplification.

Next, the second embodiment according to the present invention will be described with FIG. 4.

Figure 4:
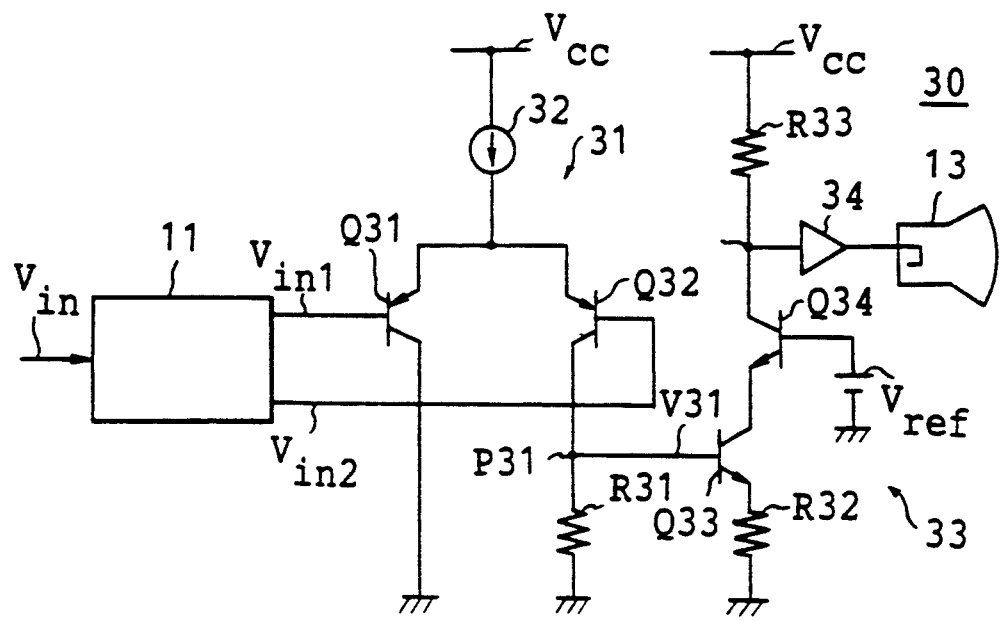
FIG. 4 is a circuit diagram showing the image output device of the second embodiment according to the present invention.

In FIG. 4, in which the identical reference numerals are given with the corresponding parts of FIG. 3, the video output circuit 30 is arranged to supply the video output signals $V_{in1}$ and $V_{in2}$, which amplifier 11, to the differential amplifier 31.

The differential amplifier 31 has the PNP type transistors Q31 and Q32 emitters of which are to be connected to the electric source voltage $V_{cc}$ via the common constant current source 32.

Here, collector of the transistor Q31 is earthed directly, and collector of the other transistor Q32 is earthed via the load resistance R31 having an approximately 50 [Ω] resistance value. The differential amplifier 31 differentially amplifies the logarithmically compressed video output signals $V_{in1}$ and transmits to the emitter earthed amplifier 33 from the connecting node P31 of the load resistance R31 and the collector as a differential output V31.

The emitter earthed amplifier 33 has a NPN type driving transistor Q33 emitter of which is earthed via load resistance R32, and collector of the transistor Q33 is cascade connected to the transistor Q34 the base of which is connected to a reference voltage source, and also can be connected to the electric source voltage $V_{cc}$ via load resistance R33.

Further, the buffer circuit 34 is connected to the connecting node P32 of the load resistance R33 and collector of the transistor Q34 and is arranged to supply an inverse output of the transistor Q33, which is low impedance driven by the transistor Q34, to the CRT 13 via the buffer circuit 34 as an output image signal $V_{out}$.

In the foregoing construction, the image output circuit 30 supplies an inverse video output signal $V_{in1}$ and in-phase video output signal $V_{in2}$ upon logarithmically compressed and amplified a video signal $V_{in}$ at the pre-drive amplifier 11, to an inverse input terminal and in-phase input terminal of the differential amplifier 31.

At this time, the differential amplifier 31 drives the emitter earthed amplifier 33 after differentially amplifies the video output signals $V_{in1}$ and $V_{in2}$, which are compressed logarithmically to an amplitude of 1/35 as against a conventional amplitude of 3.5 $[V_{pp}]$.

Then, because the differential amplifier 31 has a large driving capacity and can drive the emitter earthed amplifier 33 with a small slewing rate SR of the pre-drive amplifier 11, as small as it is, the electric power consumption can be reduced and accordingly, can be easily built in the IC.

Moreover, since a driving capacity of the driving transistor Q33 can be increased by the cascade connected transistor Q34, in case of inputting an input video signal $V_{in}$ with high frequency, such as 150 [MHz], for driving the CRT 13 for high resolution, it can be effectively avoided that degrading the amplitude of the output image signal $V_{out}$ and getting blurred its outline.

According to the foregoing construction, the image output circuit 30 is capable of driving the high resolution CRT display without increasing the slewing rate of the pre-drive amplifier 11, and also capable of having the pre-drive amplifier 11 operated in wideband, more easily built in the IC.

Next, the third embodiment according to the present invention will be described with FIG. 5.

The first embodiment discussed above has dealt with the case of having the push-pull constituted output stage in the cathode drive amplifier 12. However, the present invention is not limited to the above, but also applicable to a case of connecting the pre-drive amplifier 11 with the single end amplification stage which constitutes logarithmic comprising circuit as shown in FIG. 5, in which the corresponding parts of the FIG. 3 are given the same reference numerals.

More specifically, the video output circuit 40 is arranged to supply the video output signals $V_{in1}$ and $V_{in2}$ to be outputted from the pre-drive amplifier 11 to the differential amplifier 41 via the buffer circuits 18 and 19.

With this arrangement, the differential amplifier 41 inputs the video output signals $V_{in1}$ and $V_{in2}$ to the base of transistors Q41 and Q42 the emitters of which are connected to common constant current source 42.

Here, collectors of a pair of transistors Q41 and Q42 are connected to the base and emitter of the transistor Q43, the base of which is connected to a reference voltage source $V_{ref2}$, and the transistors Q41 and Q42 can be driven with high frequency.

Besides, collector of the transistor Q43 is connected to the load resistance R41 for current voltage converting, and the output image signal $V_{out}$ will be supplied from the connecting node P41 of the collector and the load resistance R41 to the CRT 13 via the buffer circuit 43.

With this arrangement, signal amplitudes of the video output signals $V_{in1}$ and $V_{in2}$ to be inputted to the differential amplifier 41 can be decreased, the pre-drive amplifier 11 can be more easily built in the IC and the similar effects can be obtained as the embodiment discussed above.

The embodiment discussed above has dealt with the case of setting one stage each of pre-drive amplifier and cathode drive amplifier, the present invention is not only limited to this, but also widely applicable to such a case as setting drive amplifiers corresponding to three primary colors R, G and B.

Then, in case of setting the drive amplifiers corresponding to three primary colors R, G and B, each cathode drive amplifier 12R, 12G and 12B, which is parallel connected to each constant current source 21R, 21G and 21B, and fixed current is constantly running; thus a possible risk of mutual interference among the cathode drive amplifiers 12R, 12G and 12B, to be caused by the difference of driving current outputted from each cathode drive amplifier 12R, 12G and 12B, can be effectively avoided.

Furthermore, the embodiment discussed above has dealt with the case of having the pre-drive amplifier 11 built in the IC. The present invention is not, however, limited to this, but suitably applicable to such a case where both the pre-drive amplifier 11 and the cathode drive amplifier 12 are built in the IC.

Moreover, the embodiment discussed above has dealt with the case of using the amplifier indicated in the FIG. 3 as the pre-drive amplifier 11. The present invention is not, however, limited to this, but also widely applicable to various amplifiers constituted by the logarithmic circuit.

Figure 5:
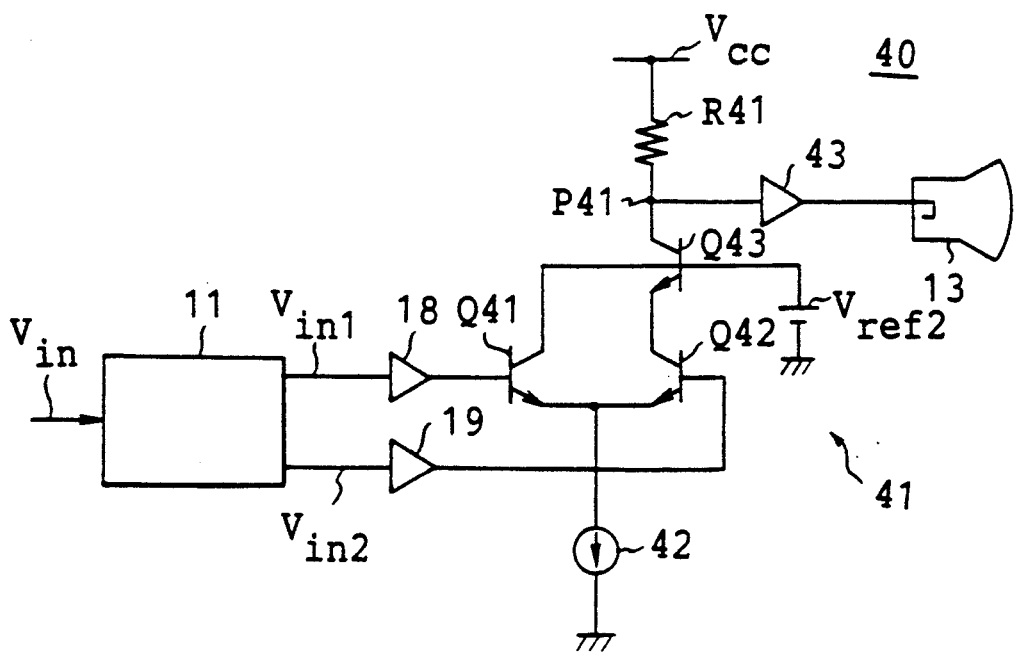
FIG. 5 is a circuit diagram showing the image output device of the third embodiment according to the present invention.

Furthermore, the embodiment discussed above has dealt with the case of using the amplifier indicated in FIG. 3 to FIG. 5 as the cathode drive amplifier. The present invention is not, however, limited to this, but is suitable for wide applications to various amplifiers constituted by the exponential converting circuit.

According to the present invention as described above, a slewing rate of the pre-drive circuit can be remarkably decreased compared to that of the prior art, by logarithmically compressing an input video signal via the logarithmic converting circuit and outputting the input video signal after amplifying at the exponential converting circuit to the image receiving tube as an output video signal, and also in the case when the frequency of the input video signal is high, the output video signal with large amplitude can be outputted; accordingly, the wideband amplifier can be more easily built in the IC.

While there has been described in connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A driving circuit apparatus comprising:

an IC incorporating logarithmic converting means for logarithmically compressing an input video signal and outputting as an output video signal;

exponential converting means coupled directly to said logarithmic converting means for inverse logarithmically converting and outputting said output video signal outputted from said logarithmic converting means as an output image signal; and driving means for outputting said output image signal outputted from said exponential converting means to a high resolution image receiving tube for use in computer aided design and drive controlling said image receiving tube.

2. A driving circuit apparatus comprising:

logarithmic converting means for logarithmically compressing an input video signal and outputting as an output video signal;

exponential converting means for inverse logarithmically converting and outputting said output video signal outputted from said logarithmic converting means as an output image signal; and driving means for outputting said output image signal outputted from said exponential converting means to an image receiving tube and drive controlling said image receiving tube; wherein:

the input video signal inputted to said logarithmic converting means is of the same order of magnitude of 0.67 [Vpp];

said output video signal outputted from said logarithmic converting means is of the same order of magnitude of 100 [mVpp] at the operating frequency; and said output image signal outputted from said logarithmic converting means is of the same order of magnitude of 45 [Vpp].

3. A driving circuit apparatus comprising:

logarithmic converting means for logarithmically compressing an input video signal and outputting as an output video signal;

exponential converting means for inverse logarithmically converting and outputting said output video signal outputted from said logarithmic converting means as an output image signal; and driving means for outputting said output image signal outputted from said exponential converting means to an image receiving tube and drive controlling said image receiving tube; wherein:

said logarithmic converting means includes a first pair of transistors, constant current sources connected to each emitter of said transistors, a load resistance which is connected between connecting nodes of emitters of said transistors and said constant current sources, and diodes connected to each collector of said transistors to logarithmically compress and then output an in-phase output and an inverse output of said input video signal; and said exponential converting means comprises a differential amplifier which input said in-phase output and inverse output, constant current circuits connected to emitters connected in common to said differential amplifier, a second pair of transistors cascade connected to the other side of terminals of said differential amplifier, a current mirror constant current circuit connected to said differential amplifier via said second pair of transistors, and a load resistance connected to one of the connecting nodes of said second pair of transistors and said current mirror constant current circuits.

4. The driving circuit apparatus according to claim 2, wherein:

the one of transistors which constitutes said current mirror constant current circuit is push-pull operated with the transistor which constitutes said differential amplifier.

5. The driving circuit apparatus according to claim 2, wherein:

the bases of said second pair of transistors are connected to a reference voltage source in common.

6. A driving circuit apparatus comprising:

logarithmic converting means for logarithmically compressing an input video signal and outputting as an output video signal;

exponential converting means for inverse logarithmically converting and outputting said output video signal outputted from said logarithmic converting means as an output image signal; and driving means for outputting said output image signal outputted from said exponential converting means to an image receiving tube and drive controlling said image receiving tube; wherein:

said logarithmic converting means includes a first pair of transistors, constant current sources connected to each emitter of said transistors, a load resistance which is connected between the connecting nodes emitters of said transistors and constant current sources, and diodes connected to each collector of said transistors to logarithmically compress and then output an in-phase output and an inverse output of said input video signal; and said exponential converting means comprises a differential amplifier to which is inputted said in-phase output and inverse output, a constant current circuit connected to emitters connected in common to the differential amplifier, a buffer transistor cascade connected to the other side of terminals of said differential amplifier, a and load resistance connected to said differential amplifier via the transistor.

7. The driving circuit apparatus according to claim 6, wherein:

the emitter of said buffer transistor is connected to the one of transistors which constitute said differential amplifier and the base of said buffer transistor is connected to a reference voltage source and the other of transistors which constitute said differential amplifier.

8. A driving circuit apparatus comprising:

logarithmic converting means for logarithmically compressing an input video signal and outputting as an output video signal;

exponential converting means for inverse logarithmically converting and outputting said output video signal outputted from said logarithmic converting means as an output image signal; and driving means for outputting said output image signal outputted from said exponential converting means to an image receiving tube and drive controlling said image receiving tube; wherein:

said logarithmic converting means includes a first pair of transistors, constant current sources connected to each emitter of said first pair of transistors, a load resistance which is connected between connecting nodes of emitters of said transistors and constant current sources, and diodes connected to each collector of said transistors to logarithmically compress and then output an in-phase output and an inverse output of said input video signal; and said exponential converting means comprises a differential amplifier for inputting said in-phase output and inverse output, a constant current source connected to emitters connected in common to said differential amplifier, an emitter earthed driving transistor which inputs the output from said differential amplifier to the base thereof, a buffer transistor cascade connected to the driving transistor, and a load resistance connected to the collector of said buffer transistor.

9. The driving circuit apparatus according to claim 8, wherein:

the base of said buffer transistor is connected to a reference voltage source.

* * * * *

UNITED STATES PATENT AND TRADEMARK OFFICE
CERTIFICATE OF CORRECTION

PATENT NO. : 5,293,101
DATED : March 8, 1994
INVENTOR(S) : Hisao Sakurai

It is certified that error appears in the above-indentified patent and that said Letters Patent is hereby corrected as shown below:

Col. 1, line 56, change "$v_{out}$" to --$V_{out}$--

Col. 2, line 11, after "[MHz]" insert --video--
Col. 6, line 53, after "which" insert --are logarithmically compressed at the pre-drive--

Col. 9, line 28, change "0.67" to --0.6--

Signed and Sealed this

Twenty-sixth Day of September, 1995

Attest:

BRUCE LEHMAN

Attesting Officer           Commissioner of Patents and Trademarks